(12) United States Patent
Cobb et al.

(10) Patent No.: US 7,491,947 B2
(45) Date of Patent: Feb. 17, 2009

(54) TECHNIQUE FOR IMPROVING PERFORMANCE AND EXTENDING LIFETIME OF INDIRECTLY HEATED CATHODE ION SOURCE

(75) Inventors: Eric R. Cobb, Danvers, MA (US); Russell J. Low, Rowley, MA (US); Craig R. Chaney, Rockport, MA (US); Leo V. Klos, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 391 days.

(21) Appl. No.: 11/505,168

(22) Filed: Aug. 16, 2006

(65) Prior Publication Data

US 2007/0085021 A1 Apr. 19, 2007

Related U.S. Application Data

(60) Provisional application No. 60/708,783, filed on Aug. 17, 2005.

(51) Int. Cl.
*H01J 27/08* (2006.01)
(52) U.S. Cl. ............... 250/426; 250/423 R; 250/424; 250/492.2; 250/492.21
(58) Field of Classification Search ........... 250/423 R, 250/424, 426, 397, 491.1, 492.2, 492.21, 250/492.24, 492.3
See application file for complete search history.

(56) References Cited

U.S. PATENT DOCUMENTS

| 5,497,006 | A | | 3/1996 | Sferlazzo et al. |
| 5,940,724 | A | * | 8/1999 | Warren ................ 438/514 |
| 6,184,532 | B1 | | 2/2001 | Dudnikov et al. |
| 6,259,210 | B1 | * | 7/2001 | Wells ................ 315/111.81 |
| 6,356,026 | B1 | * | 3/2002 | Murto ................ 315/111.81 |
| 2001/0043040 | A1 | * | 11/2001 | Olson et al. ............. 313/446 |
| 2002/0069824 | A1 | * | 6/2002 | Dangelo ................. 118/715 |
| 2003/0218428 | A1 | * | 11/2003 | Maciejowski et al. .. 315/111.81 |
| 2005/0173651 | A1 | * | 8/2005 | Goldberg et al. .......... 250/426 |
| 2006/0086376 | A1 | * | 4/2006 | Dimeo et al. ............ 134/22.1 |
| 2006/0284116 | A1 | * | 12/2006 | Berrian et al. ........ 250/492.21 |

FOREIGN PATENT DOCUMENTS

GB 2407433 A 4/2005

* cited by examiner

*Primary Examiner*—Jack I Berman
*Assistant Examiner*—Michael J Logie

(57) ABSTRACT

A technique improving performance and lifetime of indirectly heated cathode ion sources is disclosed. In one particular exemplary embodiment, the technique may be realized as a method for improving performance and lifetime of an indirectly heated cathode (IHC) ion source in an ion implanter. The method may comprise maintaining an arc chamber of the IHC ion source under vacuum during a maintenance of the ion implanter, wherein no gas is supplied to the arc chamber. The method may also comprise heating a cathode of the IHC ion source by supplying a filament with a current. The method may further comprise biasing the cathode with respect to the filament at a current level of 0.5-5 A without biasing the arc chamber with respect to the cathode. The method additionally comprise keeping a source magnet from producing a magnetic field inside the arc chamber.

14 Claims, 3 Drawing Sheets

TECHNIQUE FOR IMPROVING PERFORMANCE AND EXTENDING LIFETIME OF INDIRECTLY HEATED CATHODE ION SOURCE

CROSS-REFERENCE TO RELATED APPLICATIONS

This patent application claims priority to U.S. Provisional Patent Application No. 60/708,783, filed Aug. 17, 2005, which is hereby incorporated by reference herein in its entirety.

FIELD OF THE DISCLOSURE

The present disclosure relates generally to semiconductor manufacturing equipment and, more particularly, to a technique for improving performance and lifetime of indirectly heated cathode (IHC) ion sources.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

FIG. 1 depicts a prior art ion implanter system 100. As is typical for most ion implanter systems, the system 100 is housed in a high-vacuum environment. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 120 (located in a wafer plane 12). A number of measurement devices, such as a dose control Faraday cup 118, a traveling Faraday cup 124, and a setup Faraday cup 122, may be used to monitor and control the ion beam conditions.

Indirectly heated cathode (IHC) ion sources are typically used in high current ion implantation equipment. FIG. 2 shows a typical IHC ion source 200 in an ion implanter. The ion source 200 comprises an arc chamber 202 with conductive chamber walls 214. At one end of the arc chamber 202 there is a cathode 206 having a tungsten filament 204 located therein. The tungsten filament 204 is coupled to a first power supply 208 capable of supplying a high current. The high current may heat the tungsten filament 204 to cause thermionic emission of electrons. A second power supply 210 may bias the cathode 206 at a much higher potential than the tungsten filament 204 to cause the emitted electrons to accelerate to the cathode and so heat up the cathode 206. The heated cathode 206 may then emit electrons into the arc chamber 202. A third power supply 212 may bias the chamber walls 214 with respect to the cathode 206 so that the electrons are accelerated at a high energy into the arc chamber. A source magnet (not shown) may create a magnetic field B inside the arc chamber 202 to confine the energetic electrons, and a repeller 216 at the other end of the arc chamber 202 may be biased at a same or similar potential as the cathode 206 to repel the energetic electrons. A gas source 218 may supply a reactive species (e.g., $GeF_4$) into the arc chamber 202. The energetic electrons may interact with the reactive species to produce a plasma 20. An extraction electrode (not shown) may then extract ions 22 from the plasma 20 for use in the ion implanter.

A common cause of failure for IHC ion sources is that some materials accumulate on cathode surfaces during extended ion implantation processes. The deposited materials tend to reduce a thermionic emission rate of source ions from the cathode surfaces. Consequently, desired arc currents cannot be obtained and IHC ion sources may have to be replaced in order to maintain normal source operation. The performance degradation and short lifetime of IHC ion sources greatly reduce the productivity of ion implanters.

The above-described problems are especially significant for, but are not limited to, germanium ion implantation. Germanium ion implants have been widely used in the semiconductor industry to pre-amorphize silicon wafers in order to prevent channeling effects. The demand for these pre-amorphizing implants is expected to increase greatly in future semiconductor device manufacturing. One of the most popular source gases for germanium ion beams is germanium fluoride ($GeF_4$) due to its stable chemical properties and cost-effectiveness. However, very short lifetimes of IHC ion sources have been observed while operating with $GeF_4$ gas.

The short lifetime of an IHC ion source used in $GeF_4$ ion implantation may be attributed to excessive, free fluorine atoms in the arc chamber as a result of chemical dissociation of $GeF_4$ molecules. Specifically, arc chamber material may be etched away in chemical reactions with the fluorine atoms, and then some of the arc chamber material may eventually deposit on the cathode resulting in the degradation of electron emissions from the cathode surface.

Other source gases, such as boron fluoride ($BF_3$) and phosphorous fluoride ($PH_3$), may be employed in ion implantation and may cause similar lifetime shortening of IHC ion sources by the stripping (sputtering) of cathode material.

In view of the foregoing, it would be desirable to provide a solution for improving the performance and extending the lifetime of IHC ion sources which overcomes the above-described inadequacies and shortcomings.

SUMMARY OF THE DISCLOSURE

A technique improving performance and lifetime of indirectly heated cathode ion sources is disclosed. In one particular exemplary embodiment, the technique may be realized as a method for improving performance and lifetime of an indirectly heated cathode (IHC) ion source in an ion implanter. The method may comprise maintaining an arc chamber of the IHC ion source under vacuum during a maintenance of the ion implanter, wherein no gas is supplied to the arc chamber. The method may also comprise heating a cathode of the IHC ion source by supplying a filament with a current. The method may further comprise biasing the cathode with respect to the filament at a current level of 0.5-5 A without biasing the arc chamber with respect to the cathode. The method additionally comprise keeping a source magnet from producing a magnetic field inside the arc chamber.

In accordance with other aspects of this particular exemplary embodiment, the method may further comprise positioning a Faraday cup to block an ion beam from entering an end-station of the ion implanter when the ion implanter is not processing wafers.

In another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In yet another particular exemplary embodiment, the technique may be realized as at least one processor readable carrier for storing a computer program of instructions configured to be readable by at least one processor for instructing the at least one processor to execute a computer process for performing the method as recited above.

In still another particular exemplary embodiment, the technique may be realized as a method for improving performance and lifetime of an indirectly heated cathode (IHC) ion source in an ion implanter. The method may comprise supplying an argon gas or a process gas to an arc chamber of the IHC ion source. The method may also comprise biasing the arc chamber with respect to the cathode at 45-55 volts. The method may further comprise generating a source current of 1-8 mA from a filament-heated cathode. The method may keep the ion implanter idling in an active state.

In accordance with other aspects of this particular exemplary embodiment, the method may further comprise producing a magnetic field inside the arc chamber by supplying source magnet with a current.

In accordance with further aspects of this particular exemplary embodiment, an analyzer magnet in the ion implanter may be configured with an atomic mass unit setting of 40.

In accordance with additional aspects of this particular exemplary embodiment, the method may further comprise positioning a Faraday cup to block an ion beam from entering an end-station of the ion implanter when the ion implanter is not processing wafers.

In a further particular exemplary embodiment, the technique may be realized as a method for improving performance and lifetime of an indirectly heated cathode (IHC) ion source in an ion implanter. The method may comprise supplying a process gas to an arc chamber of the IHC ion source. The method may also comprise biasing the arc chamber with respect to the cathode at 45-60 volts. The method may further comprise generating a source current of 10-50 mA from a filament-heated cathode, whereby reducing one or more materials deposited in the arc chamber and the filament-heated cathode.

In accordance with other aspects of this particular exemplary embodiment, the method may further comprise producing a magnetic field inside the arc chamber by supplying source magnet with a current.

In accordance with further aspects of this particular exemplary embodiment, the process gas may comprise an arsine ($AsH_3$) gas.

In accordance with additional aspects of this particular exemplary embodiment, an analyzer magnet in the ion implanter may be configured with an atomic mass unit setting of 75.

In accordance with a further aspect of this particular exemplary embodiment, the method may comprise generating the source current for approximately 0.2-4 hours after the IHC ion source has generated germanium ions for ten hours.

In accordance with a yet further aspect of this particular exemplary embodiment, the method may further comprise generating the source current for approximately 0.2-4 hours after the IHC ion source has generated germanium ions for ten hours.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure may improve the performance and extend the lifetime of IHC ion sources through advantageous configuration settings for IHC ion source modes in ion implanters such as, for example, a VIISta HC high current ion implantation system by Varian Semiconductor Equipment Associates, Inc. The IHC ion source modes may comprise, for example, an idle mode, a keep warm mode, and a cleaning/conditioning mode. These modes may typically be employed to reduce and/or clean deposits and flaking in the arc chamber of an IHC ion source when the IHC ion source is shutdown or idled between runs.

Figure 1:
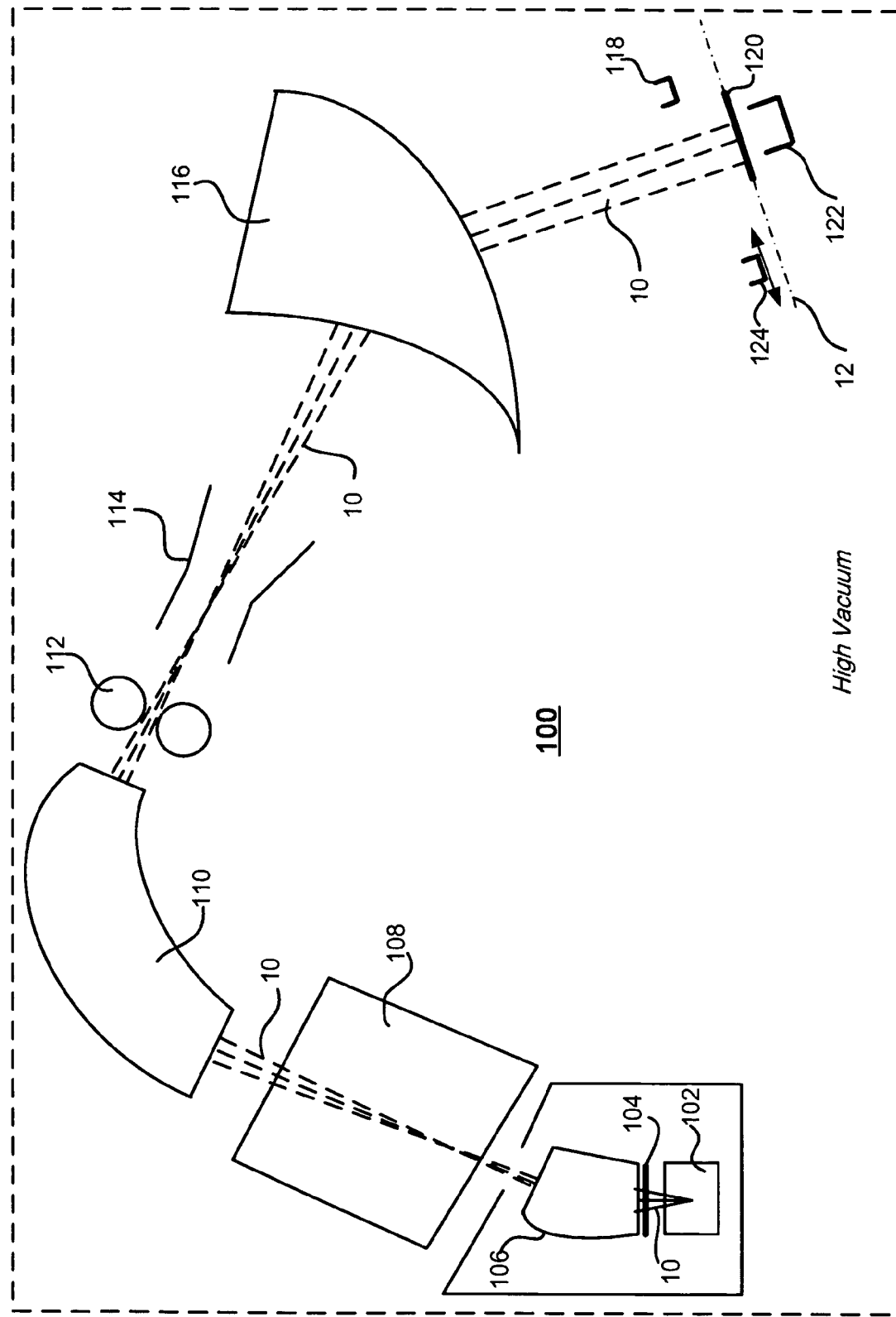
FIG. 1 shows a prior art ion implanter system.
Figure 2:
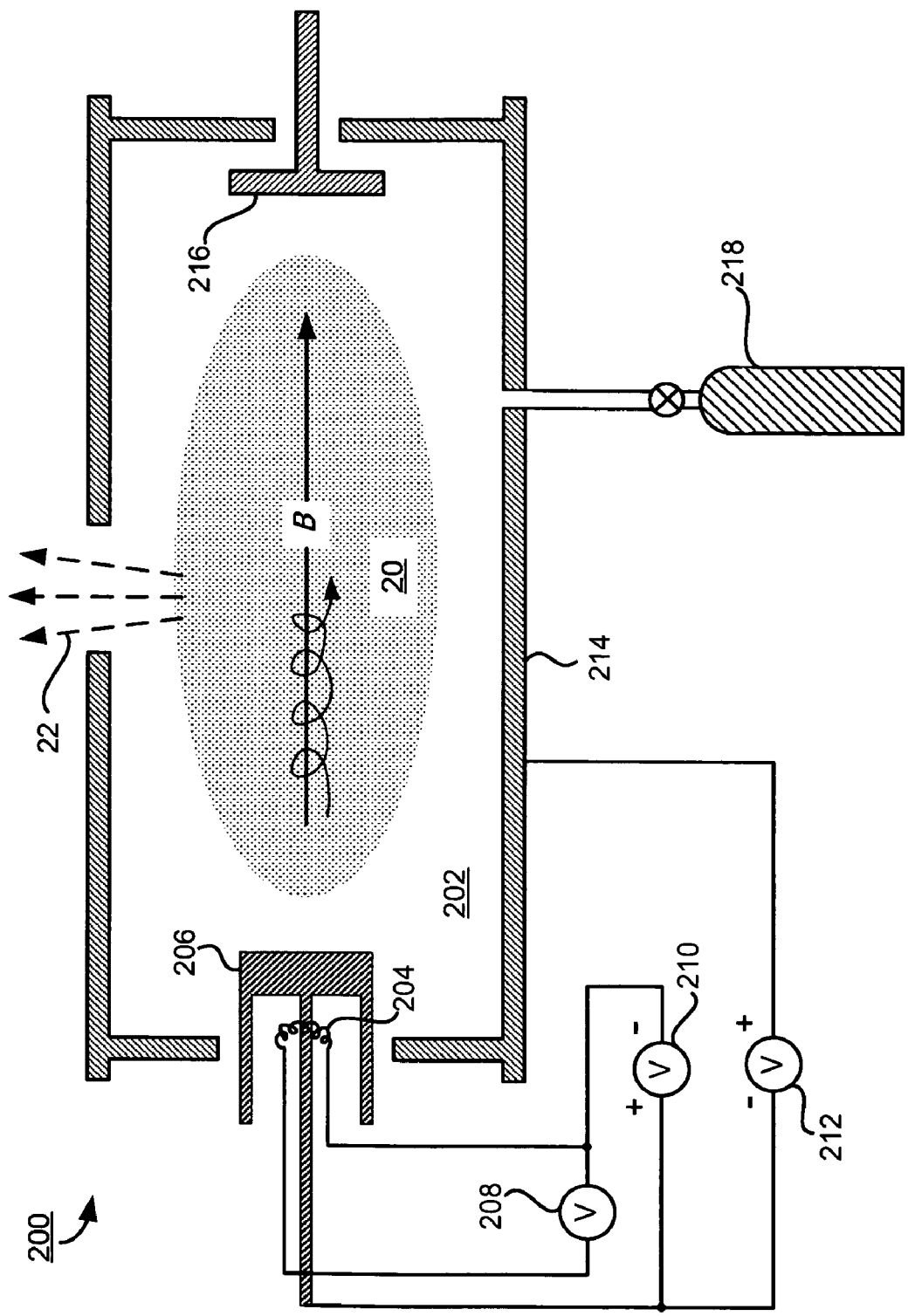
FIG. 2 shows a typical IHC ion source in an ion implanter.

A keep warm mode may help maintain an IHC ion source under vacuum and the arc chamber temperature at a level that reduces flaking internally, during an extended maintenance cycle. Exemplary configuration settings for an IHC source in a keep warm mode may be:

| | |
|---|---|
| Arc V | 0.0 |
| Filament I | 90-120 A |
| Bias I | 0.5-5.0 A |
| Source Magnet | 0.0 |
| Gas Process | 0.0 |
| Gas Dilution | 0.0 |
| Mass AMU | 70.0-75.0 A | wherein Arc V is an arc voltage setting, Filament I is a filament current setting, Bias I is a bias current setting, Source Magnet is an IHC source magnetic field setting, Gas Process is a process gas setting, Gas Dilution is a percentage of dilution gas to be mixed with the process gas, and Mass AMU is an atomic mass unit setting of an analyzer magnet in the ion implanter. The arc voltage may be applied (e.g., by the power supply 212) between the arc chamber walls 214 and the cathode 206 as shown in FIG. 2. The filament current may be supplied (e.g., by the power supply 208) to the filament 204 as shown in FIG. 2. The bias current may be the current flowing through the power supply 210 as a result of biasing the cathode 206 with respect to the filament 204. The analyzer magnet may be kept on in the keep warm mode in order to reduce magnet drift.

An idle mode may help maintain an idling ion implanter in an active state by running an inert or implant process gas. With a standard Ar 20 KeV recipe, exemplary configuration settings for an IHC ion source in an idle mode may be:

| | | |
|---|---|---|
| Arc V | 45-55 | V |
| Filament I | 90-120 | A |
| Source I | 1-8 | mA |
| Source Magnet | 2-8 | A |
| Gas Process | 0.5-2.5 | sccm Argon HP |
| Gas Dilution | 0.0-0.4 | sccm |
| Mass AMU | 40.0 | | wherein Source I is a source current setting and HP refers to a high pressure delivery system.

A cleaning/conditioning mode may be employed to remove deposits from the arc chamber, especially the cathode surface, of an IHC ion source. With a standard As 20 KeV, 16 mA ROI recipe, exemplary configuration settings for an IHC ion source in a cleaning mode may be:

| | | |
|---|---|---|
| Filament I | 90-120 | A |
| Source I | 10-50 | mA |
| Arc V | 45-60 | V |
| Source Magnet | 1.8-5.0 | A |
| Gas Process | AsH$_3$ 3-4 | sccm SDS/ |
| | 1.6-2.0 | sccm HP |
| Gas Dilution | 0.0-0.4 | sccm |
| Mass AMU | 75.0 | | wherein ROI is a region of interest (i.e., a wafer), HP is a High Pressure Delivery System and SDS is a safe delivery system. In this particular example, GeF$_4$ to AsH$_3$ (residual Ge reduction), As 20 Kev/As 40 Kev, 15 mA for 1-2 hours; levels decrease over time. Also, it is recommended that running 10 hours of germanium may require approximately 2 hours of arsenic for conditioning. Furthermore, customer recipes running AsH$_3$ may be used as a cleaner as well.

It should be noted that, according to some embodiments, all of the above IHC ion source modes may be entered from a GeF$_4$ operation (for SDS, HP, HP enriched gas) mode having the following configuration settings for an IHC ion source:

| | | |
|---|---|---|
| Arc V | 80-100 | V |
| Source Magnet | 2.0-9.0 | A |
| Gas Process | 0.2-1.9 | sccm (SDS) |
| | 0.2-2.5 | sccm (HP) |
| | 0.2-2.5 | sccm (HP enriched) |
| Gas Dilution | 0.2-1.0 | sccm (Ar) (SDS) |
| | 0.2-1.0 | sccm (Ar) (HP) |
| | 0.2-1.0 | sccm (Ar) (HP enriched) | wherein Source Magnet settings below 2.0 will increase beam current though they will also shorten the lifetime of the IHC ion source due to plasma-increased tungsten sputtering.

At this point it should be noted that all of the mode examples include example ranges which may be altered significantly.

According to embodiments of the present disclosure, a precursor step may be implemented for the different IHC ion source modes described above. If any of the modes is chosen, the ion implanter may wait for a specified amount of time (e.g., 10 minutes) before kicking in the "keep warm mode," "idle mode," or the "cleaning/conditioning mode." A first step in each of these modes may be to put in the setup Faraday cup. The purpose of positioning the setup Faraday cup is to prevent the ion beam, which is set up according to an implantation recipe, from entering end-station dose cups or beam dumps, so that the ion beam will not produce particles from deposit accumulation. Typically, during a kick-in time of 10 minutes or less, not many particles are produced. However, if the kick-in time is set for too long, for example, 20-30 minutes, as might sometimes be needed to wait for a next batch of wafers to arrive at the ion implanter, excessive particles may be produced in the end-station.

To avoid the particle contamination, the ion implanter may be configured so that, if any of the modes is activated, the setup Faraday cup will go in first immediately or after a specified period of time (e.g., 10 minutes). However, the ion beam may remain unchanged in case another batch of wafers requiring the same recipe shows up. This may prevent the ion beam from going into the end-station while it waits the additional 10-20 minutes for one of the modes to finally kick-in.

Figure 3:
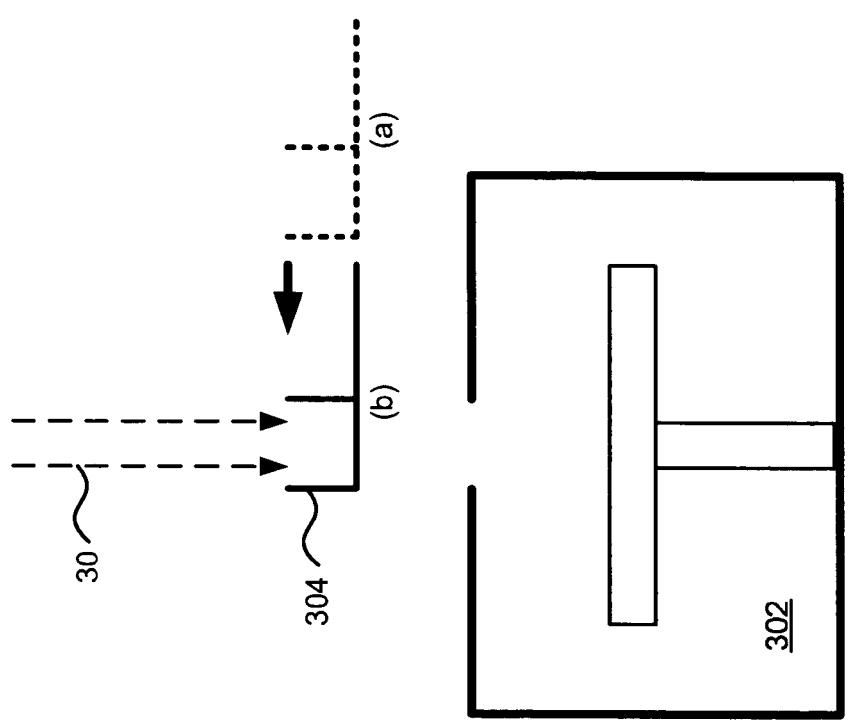
FIG. 3 shows an exemplary end-station of an ion implanter in accordance with an embodiment of the present disclosure.

FIG. 3 shows an exemplary end-station 302 in accordance with an embodiment of the present disclosure. The end-station 302 may house wafers that are subject to ion implantation by an ion beam 30. During ion implantation, a setup Faraday cup 304 may be parked in position (a). After the ion implantation is completed on a batch of wafer, the ion beam 30 continues entering the end-station 302 and may cause produce unwanted particles therein. Therefore, it may be desirable to move the setup Faraday cup to position (b) to block the ion beam 30 from entering the end-station 302. If a next batch of wafer is expected to be implanted soon with the same recipe as the batch just finished, the ion implanter may be maintained in the same state while waiting for the next batch. Otherwise, the ion implanter may cause its IHC ion source to enter into one of the modes described above, typically after waiting for a predetermined period of time (e.g., 10 minutes).

At this point it should be noted that the IHC ion source modes in accordance with the present disclosure as described above typically involves the processing of input data and the generation of output data to some extent. This input data processing and output data generation may be implemented in hardware or software. For example, specific electronic components may be employed in an ion implantation control system or similar or related circuitry for implementing the functions associated with IHC ion source modes in accordance with the present disclosure as described above. Alternatively, one or more processors operating in accordance with stored instructions may implement the functions associated with IHC ion source modes in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of envi-

The invention claimed is:

1. A method for improving performance and lifetime of an indirectly heated cathode (IHC) ion source in an ion implanter, the method comprising the steps of: maintaining an arc chamber of the IHC ion source under vacuum during a maintenance of the ion implanter, wherein no gas is supplied to the arc chamber; heating a cathode of the IHC ion source by supplying a filament with a current; biasing the cathode with respect to the filament at a current level of 0.5-5 A without biasing the arc chamber with respect to the cathode; and keeping a source magnet from producing a magnetic field inside the arc chamber.

2. The method according to claim 1, further comprising:
positioning a Faraday cup to block an ion beam from entering an end-station of the ion implanter when the ion implanter is not processing wafers.

3. At least one signal embodied in at least one carrier wave for transmitting a computer program of instructions configured to be readable by at least one processor for instructing the at least one processor to execute a computer process for performing the method as recited in claim 1.

4. At least one processor readable carrier for storing a computer program of instructions configured to be readable by at least one processor for instructing the at least one processor to execute a computer process for performing the method as recited in claim 1.

5. A method for improving performance and lifetime of an indirectly heated cathode (IHC) ion source in an ion implanter, the method comprising the steps of: supplying an argon gas or a process gas to an arc chamber of the IHC ion source; biasing the arc chamber with respect to a filament heated cathode at 45-55 volts; generating a source current of 1-8 mA from the filament-heated cathode; and whereby keeping the ion implanter idling in an active state.

6. The method according to claim 5, further comprising:
producing a magnetic field inside the arc chamber by supplying source magnet with a current.

7. The method according to claim 5, wherein an analyzer magnet in the ion implanter is configured with an atomic mass unit setting of 40.

8. The method according to claim 5, further comprising:
positioning a Faraday cup to block an ion beam from entering an end-station of the ion implanter when the ion implanter is not processing wafers.

9. A method for improving performance and lifetime of an indirectly heated cathode (IHC) ion source in an ion implanter, the method comprising the steps of: supplying a process gas to an arc chamber of the IHC ion source; biasing the arc chamber with respect to a filament heated cathode at 45-60 volts; and generating a source current of 10-50 mA from the filament-heated cathode, whereby reducing one or more materials deposited in the arc chamber and the filament-heated cathode.

10. The method according to claim 9, further comprising:
producing a magnetic field inside the arc chamber by supplying source magnet with a current.

11. The method according to claim 9, wherein the process gas comprises an arsine ($AsH_3$) gas.

12. The method according to claim 9, wherein an analyzer magnet in the ion implanter is configured with an atomic mass unit setting of 75.

13. The method according to claim 9, further comprising:
generating the source current for approximately 0.2-4 hours after the IHC ion source has generated germanium ions for ten hours.

14. The method according to claim 9, further comprising:
positioning a Faraday cup to block an ion beam from entering an end-station of the ion implanter when the ion implanter is not processing wafers.

* * * * *